United States Patent
Lim et al.

(10) Patent No.: US 9,626,897 B2
(45) Date of Patent: Apr. 18, 2017

(54) ORGANIC LIGHT EMITTING DIODE DISPLAY DEVICE AND METHOD OF MANUFACTURING THE SAME

(71) Applicant: Samsung Display Co., Ltd., Yongin, Gyeonggi-Do (KR)

(72) Inventors: Young-In Lim, Yongin (KR); Kyu-Ho Jung, Yongin (KR); Sang-Hee Choi, Yongin (KR)

(73) Assignee: Samsung Display Co., Ltd., Samsung-ro, Gibeung-Gu, Yongin-si, Gyeonggi-Do (KR)

( * ) Notice: Subject to any disclaimer, the term of this patent is extended or adjusted under 35 U.S.C. 154(b) by 291 days.

(21) Appl. No.: 13/828,434

(22) Filed: Mar. 14, 2013

(65) Prior Publication Data

US 2014/0118230 A1    May 1, 2014

(30) Foreign Application Priority Data

Oct. 29, 2012  (KR) .................... 10-2012-0120457

(51) Int. Cl.
  *G09G 3/32* (2016.01)
  *H01L 51/56* (2006.01)
  *G09G 3/3208* (2016.01)
  *H01L 51/52* (2006.01)

(52) U.S. Cl.
  CPC ......... *G09G 3/3208* (2013.01); *H01L 51/524* (2013.01)

(58) Field of Classification Search
  CPC .................................................. H01L 51/524

USPC .............................................................. 345/82
See application file for complete search history.

(56) References Cited

U.S. PATENT DOCUMENTS

| | | | |
|---|---|---|---|
| 2002/0074931 A1* | 6/2002 | Liedenbaum | H01L 51/5246 313/493 |
| 2004/0123663 A1* | 7/2004 | Saitoh et al. | 73/514.33 |
| 2009/0322214 A1* | 12/2009 | Lee | H01L 51/524 313/504 |
| 2010/0090587 A1* | 4/2010 | Tsujimura | H01L 51/5246 313/504 |
| 2012/0007106 A1 | 1/2012 | Jung et al. | |
| 2012/0105340 A1 | 5/2012 | Beom et al. | |
| 2012/0105956 A1 | 5/2012 | Jeong et al. | |
| 2012/0147299 A1 | 6/2012 | Park | |
| 2012/0204459 A1 | 8/2012 | Hirai et al. | |
| 2012/0307430 A1 | 12/2012 | Lee | |

FOREIGN PATENT DOCUMENTS

| | | |
|---|---|---|
| KR | 100798632 | 1/2008 |
| KR | 101117399 | 2/2012 |
| KR | 1020120044501 | 5/2012 |

* cited by examiner

*Primary Examiner* — Calvin Choi
*Assistant Examiner* — Xiaoming Liu
(74) *Attorney, Agent, or Firm* — Robert E. Bushnell, Esq.

(57) ABSTRACT

An organic light emitting diode (OLED) display device includes a display panel that has a plurality of signal lines and a plurality of pixels to display an image, a cover window that is positioned at the outside of a display surface of the display panel, and an adhesive layer that is positioned between the display surface and the cover window. One of the display panel and the cover window forms a concave channel in at least one corner, and the adhesive layer fills the channel.

10 Claims, 11 Drawing Sheets under 35 U.S.C. §119 from an application earlier
ORGANIC LIGHT EMITTING DIODE DISPLAY DEVICE AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Oct. 29, 2012 and there duly assigned Serial No. 10-2012-0120457.

BACKGROUND OF THE INVENTION

Field of the Invention

The present invention relates generally to an organic light emitting diode (OLED) display device. More particularly, the invention relates to an OLED display device and a method of manufacturing the same that enhance adhesion reliability between a display panel and a cover window.

Description of the Related Art

Unlike liquid crystal displays (LCDs), OLED displays have a self light emitting characteristic, do not require a separate light source, and can thus reduce a thickness and a weight thereof. Furthermore, the OLED display represents high quality characteristics of lower power consumption, high luminance, and a fast response speed.

The OLED display includes a display panel having a plurality of signal lines and a plurality of pixels, a flexible printed circuit (FPC) having a control circuit that sends a control signal to the display panel, and a circuit film that connects the display panel and the FPC. Furthermore, the OLED display includes a cover window (or a transparent protection portion) that covers and protects a display surface of the display panel.

The display panel and the cover window are mutually bonded by an adhesive layer. The adhesive layer includes an acryl-based resin that is cured by ultraviolet (UV) rays or heat. Cohesion of the display panel and the cover window using the adhesive layer is performed by a process of applying an adhesive material to a central part of the cover window, widely spreading the adhesive material by pressing with a stack of the display panel and the cover window, and curing the adhesive material by applying UV rays or heat to the adhesive material.

However, in the foregoing method, because the adhesive material is spread in a round form toward a corner of the display panel, a non-application failure in which the adhesive layer does not fill an entire corner of the display panel may occur. Accordingly, adhesion reliability of the corner side is deteriorated, and a failure in which the display panel and the cover window are not mutually bonded may occur at the corner side.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide an OLED display device and a method of manufacturing the same having the advantages of enhancing adhesion reliability of a display panel and a cover window by increasing an occupying area of an adhesive layer at the corner side of the display panel.

An exemplary embodiment provides an OLED display device including: a display panel that displays an image; a cover window that is positioned at the outside of a display surface of the display panel; and an adhesive layer that is positioned between the display surface and the cover window. Any one of the display panel and the cover window forms a concave channel in at least one corner filled with the adhesive material.

The display panel may include a first substrate that has a display area and a pad area and a second substrate that is attached to the first substrate so as to cover the display area. The display surface may be an outer surface of the second substrate.

The second substrate may have four orthogonal corners and the channel may be formed in at least one location of the four orthogonal corners. The channel contacting with an edge of the corner may be formed in a diagonal direction at the corner of the second substrate and be positioned at the outside of the display area.

The channel may be formed in a single bar type and have a section shape of a quadrangle, a triangle, an oval, or a semicircle. The channel may be formed with a plurality of micro channels having a triangular section shape parallel to each other.

The cover window may cover the second substrate and the pad area and may include a light blocking portion corresponding to an edge of the display area including the pad area and a light emitting portion corresponding to the display area. The second substrate may have four orthogonal corners and the channel may be formed at a position opposite to at least one corner of the four orthogonal corners on an inner surface of the cover window.

The channel may be formed in a diagonal direction and be positioned at the light blocking portion. The channel may be formed in a single bar type and have a section shape of a quadrangle, a triangle, an oval, or a semicircle. The channel may be formed with a plurality of micro channels parallel to each other, and the plurality of micro channels each may have a triangular section shape.

Another embodiment provides a method of manufacturing an OLED display device, the method including: i) providing a display panel including a first substrate having a display area and a pad area, and a second substrate that covers the display area; ii) providing a cover window; iii) applying an adhesive material on the cover window or the second substrate; iv) disposing the cover window on the second substrate, and widely spreading the adhesive material by applying a pressure to the cover window; and v) forming an adhesive layer by curing the adhesive material. A concave channel is formed at a corner of any one of the second substrate and the cover window for spreading of the adhesive material widely, the adhesive material moves toward a corner edge of the second substrate along the channel.

The adhesive material may include an acryl-based resin and be cured by ultraviolet (UV) rays or heat to form the adhesive layer. The adhesive material may form the adhesive layer by filling a space between the second substrate including the channel and the cover window.

As the channel is formed at a corner of the second substrate or the cover window, an occupying area of the adhesive layer is enlarged at the corner of the second substrate, and the adhesive layer is precisely formed up to a corner edge of the second substrate. Therefore, a looseness failure between the display panel and the cover window is prevented, and adhesion reliability can be enhanced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In addition, in the specification, unless explicitly described to the contrary, the word "comprise", and variations such as "comprises" or "comprising", will be understood to imply the inclusion of stated elements but not the exclusion of any other elements. When it is said that any part, such as a layer, film, region, or plate, is positioned on another part, it means the part is directly on the other part or above the other part with at least one intermediate part. Furthermore, in the specification, an upper part of a target portion indicates an upper part or a lower part of a target portion, and it does not mean that the target portion is always positioned at the upper side based on a gravity direction.

Figure 1:
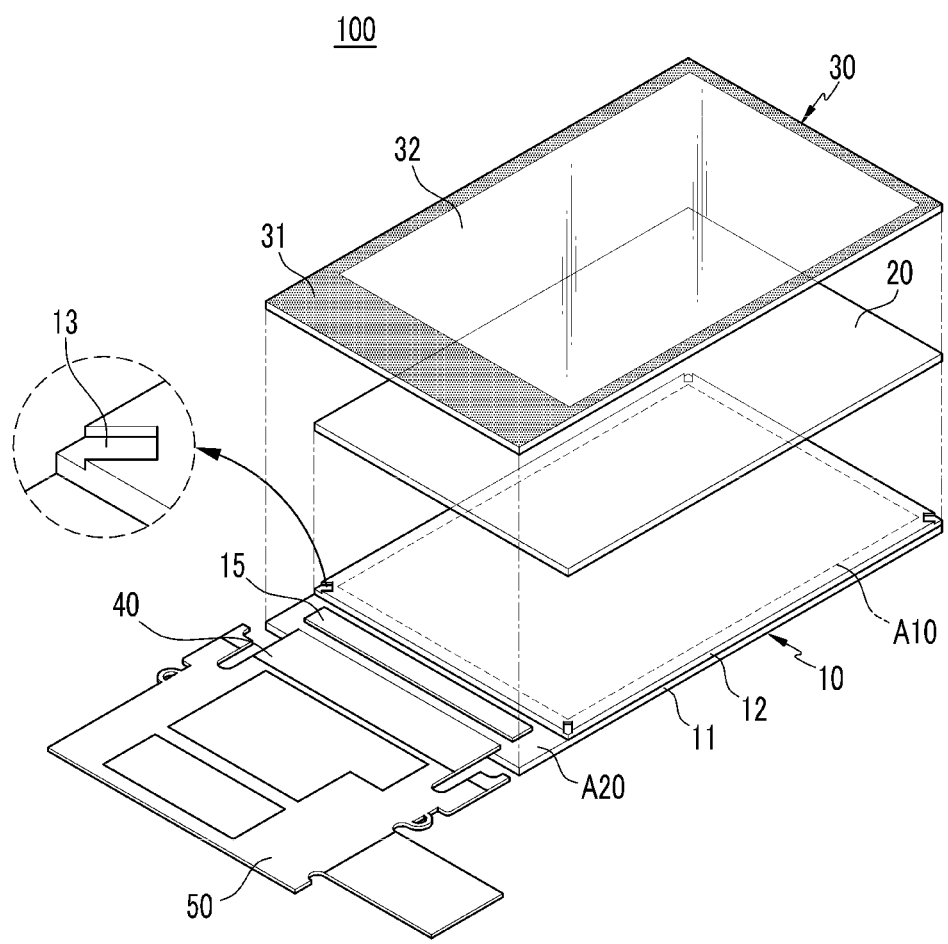
FIG. 1 is an exploded perspective view illustrating an OLED display device according to a first exemplary embodiment of the invention.
Figure 2:
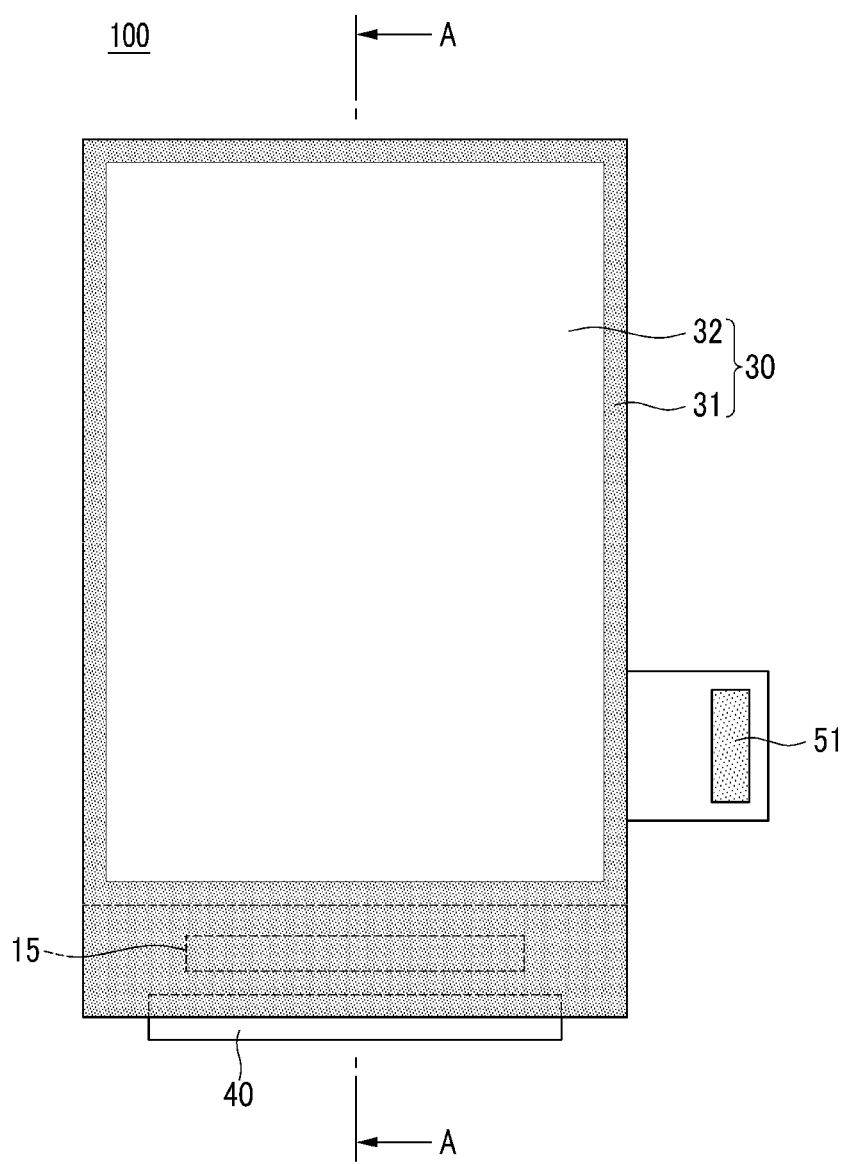
FIG. 2 is a top plan view illustrating a coupling state of the OLED display device of FIG. 1.
Figure 3:
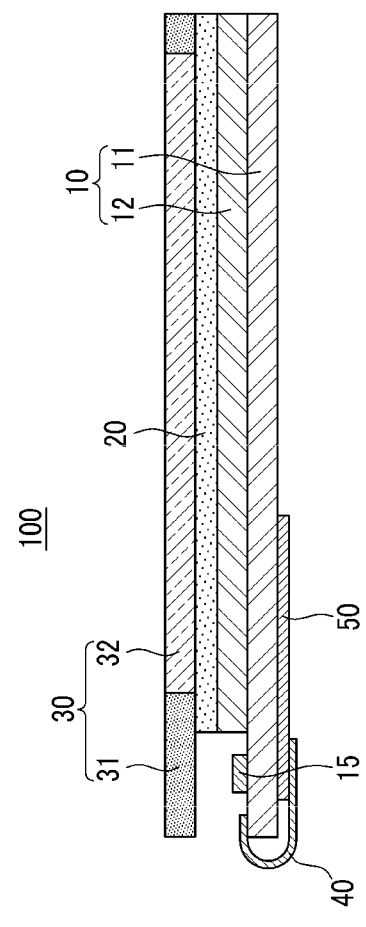
FIG. 3 is a cut-away cross-sectional view illustrating the OLED display device taken along line A-A of FIG. 2.

FIG. 1 is an exploded perspective view illustrating an OLED display device according to a first exemplary embodiment of the invention, FIG. 2 is a top plan view illustrating a coupling state of the OLED display device of FIG. 1, and FIG. 3 is a cut-away cross-sectional view illustrating the OLED display device taken along line A-A of FIG. 2.

Referring to FIGS. 1 to 3, an OLED display device 100 of the first exemplary embodiment includes a display panel 10 that displays an image, and an adhesive layer 20 and a cover window 30 that cover a display surface of the display panel 10. Furthermore, the OLED display device 100 includes a circuit film 40 and an FPC 50 that are connected to the display panel 10.

The display panel 10 includes a first substrate 11 having a display area A10 and a pad area A20, and a second substrate 12 that is bonded on the first substrate 11. A plurality of signal lines (including scan lines and data lines) and a plurality of pixels are positioned at the display area A10 of the first substrate 11, and a plurality of pad electrodes (not shown) are positioned at the pad area A20.

An integrated circuit chip 15 is positioned at the pad area A20 of the first substrate 11, and a scan driver (not shown) and a data driver (not shown) are positioned at the outside of the display area A10 of the first substrate 11. The scan driver supplies a scan signal to a plurality of pixels through the scan lines, and the data driver supplies a data signal to a plurality of pixels through the data lines.

The second substrate 12 is formed in a size smaller than that of the first substrate 11 and is attached to the display area A10 of the first substrate 11. The first substrate 11 and the second substrate 12 are integrally bonded by a sealant (not shown) that is applied along an edge of the second substrate 12. The second substrate 12 is an encapsulation substrate and seals a plurality of pixels, thereby protecting the plurality of pixels from an external environment including moisture and oxygen.

The FPC 50 includes an electronic element (not shown) for processing a driving signal and a connector 51 for receiving an external signal. The circuit film 40 electrically and physically connects the display panel 10 and the FPC 50. An end portion of one side of the circuit film 40 is fixed to the pad area A20 so as to be electrically connected to pad electrodes, and an end portion of an opposite side thereof is fixed to the FPC 50 so as to be electrically connected to wires of the FPC 50.

A driving signal that is generated in the FPC 50 is transferred to the display panel 10 through the circuit film 40, and the display panel 10 displays an image using light that is generated in a plurality of pixels. Light that is generated in a plurality of pixels transmits the second substrate 12 and is emitted to the outside. In this case, a display surface of the display panel 10 becomes an outer surface of the second substrate 12. The circuit film 40 is bent toward the outer surface of the first substrate 11 and enables the FPC 50 to be positioned at the outside of the first substrate 11.

The cover window 30 is positioned at the outside of a display surface of the display panel 10 and protects the display surface from an external impact and scratch that are applied from the outside of the display surface. Specifically, the cover window 30 is positioned at the outside of the second substrate 12 and covers all of the second substrate 12 and the pad area A20. The cover window 30 is made of a transparent material such as glass or transparent plastic.

The cover window 30 includes a light blocking portion 31 corresponding to an edge of the display panel 10 including the pad area A20 of the first substrate 11 and a light emitting portion 32 corresponding to the display area A10. The light blocking portion 31 performs a function of blocking unnecessary light and covering a portion in which an image is not displayed in the display panel 10. The cover window 30 may be entirely transparently formed without forming the light blocking portion 31.

The adhesive layer 20 is positioned between the display panel 10 and the cover window 30 and mutually bonds the display panel 10 and the cover window 30. The adhesive layer 20 fills space between the second substrate 12 and the cover window 30 and is formed in the same area as that of the second substrate 12. In this case, a predetermined space is formed between the cover window 30 and the pad area A20 of the first substrate 11.

The adhesive layer 20 includes an acryl-based resin that is cured by UV rays or heat. The adhesive layer 20 is first applied at the center of the second substrate 12 or the cover window 30 in a liquid or paste form, and is entirely widely spread to the second substrate 12 and the cover window 30 by an applied pressure in a process of stacking the display panel 10 and the cover window 30.

When the adhesive layer 20 is widely spread to precisely fill entire space between the second substrate 12 and the cover window 30, the adhesive layer 20 can exert an excellent adhesion performance. Particularly, because the second substrate 12 and the cover window 30 are formed in a quadrangle having four orthogonal corners, when the adhesive layer 20 is precisely filled at entire orthogonal corners, adhesion reliability of the display panel 10 and the cover window 30 can be enhanced.

Figure 4:
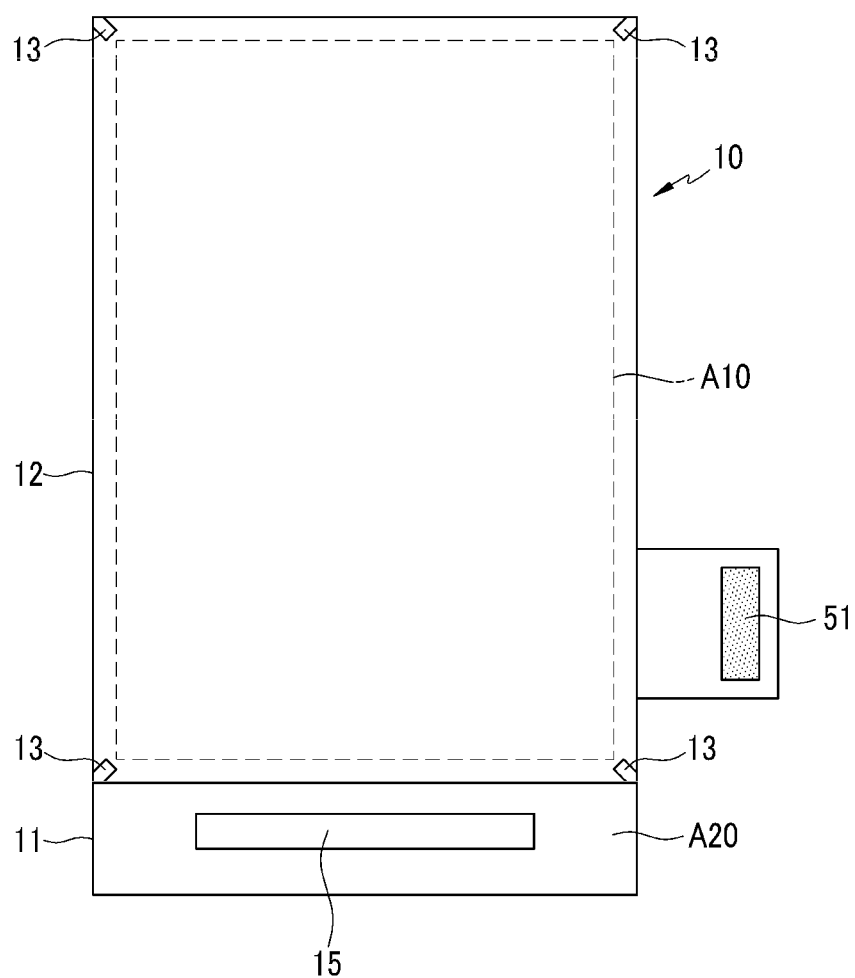
FIG. 4 is a top plan view illustrating a display panel of the OLED display device that is shown in FIG. 1.
Figure 5:
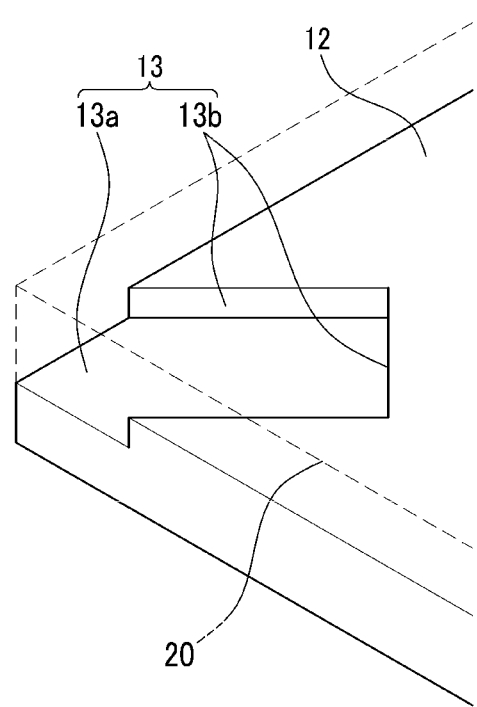
FIG. 5 is a partial enlarged view illustrating the display panel of FIG. 4.

FIG. 4 is a top plan view illustrating a display panel of the OLED display device that is shown in FIG. 1, and FIG. 5 is a partially enlarged view illustrating the display panel of FIG. 4.

Referring to FIGS. 4 and 5, the second substrate 12 forms a channel 13 that guides flow of an adhesive material in at least one corner of four orthogonal corners. FIG. 4 illustrates a case where the second substrate 12 forms the channel 13 at all four orthogonal corners.

The channel 13 is formed with a concave groove that is formed at an outer surface of the second substrate 12 and is formed in a diagonal direction at the corner of the second substrate 12. Here, the 'diagonal direction' is defined as a direction having a predetermined angle relative to the long side and the short side of the second substrate 12. For example, the channel 13 may have a tilt angle of 45° relative to the long side and the short side of the second substrate 12. The tilt angle of the channel 13 is not limited to 45° and can be variously set according to a spreading form of an adhesive material.

The channel 13 is formed in a single bar type having a constant width and a predetermined length, and has a square section shape. In this case, the channel 13 includes a flat bottom portion 13a and a plurality of vertical side walls 13b. The channel 13 is formed so as to contact a corner edge of the second substrate 12. Therefore, the channel 13 is entirely formed in a square bar type, but an end portion of the channel 13 has an orthogonal form corresponding to the corner edge.

The channel 13 is positioned at the outside of the display area A10 so as not to invade the display area A10. That is, the channel 13 is formed at a position corresponding to the light blocking portion 31 of the cover window 30 of the second substrate 12 and enables a step of the second substrate 12 due to the channel 13 not to have an influence on an image display.

When an adhesive material that is applied to a central portion of the second substrate 12 or the cover window 30 is widely spread by a stack pressure of the display panel 10 and the cover window 30, the channel 13 of the foregoing configuration performs a function of enhancing spread of the adhesive material by guiding flow of the adhesive material in a length direction of the channel 13. Therefore, the adhesive layer 20 fills an upper portion of the corner of the second substrate 12 including the channel 13.

In this way, an occupying area of the adhesive layer 20 is enlarged at the corner of the second substrate 12 as the channel 13 is formed at the corner of the second substrate 12, and the adhesive layer 20 is precisely formed up to a corner edge of the second substrate 12. As a result, the OLED display device 100 of the first exemplary embodiment can enhance adhesion reliability of the display panel 10 and the cover window 30.

Figure 6:
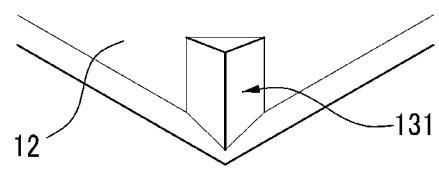
FIGS. 6 to 8 are partial enlarged views of a second substrate illustrating several exemplary variations of a channel that is shown in FIG. 5.
Figure 7:
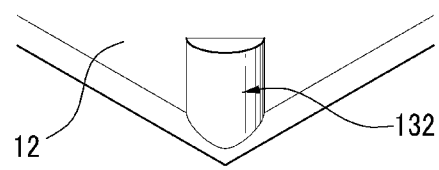
Figure 8:
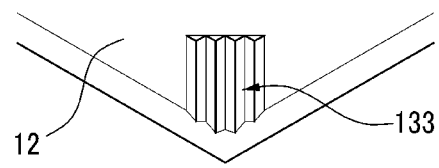

FIGS. 6 to 8 are partially enlarged views of a second substrate illustrating several exemplary variations of a channel that is shown in FIG. 5.

Referring to FIG. 6, a channel 131 may have a triangular section shape, and in this case, two inclined surfaces form a channel. Referring to FIG. 7, a channel 132 may have an oval or semicircular section shape. Referring to FIG. 8, a channel 133 is formed with a plurality of micro channels parallel to each other, and each micro channel may have a triangular section shape.

The shape of the channels 13 (FIGS. 4 and 5), 131 (FIG. 6), 132 (FIG. 7), and 133 (FIG. 8) is not limited to illustrated examples and may be formed in a depressed form at a corner of the second substrate 12 so as to guide flow of the adhesive material toward a corner edge of the second substrate 12.

Figure 9:
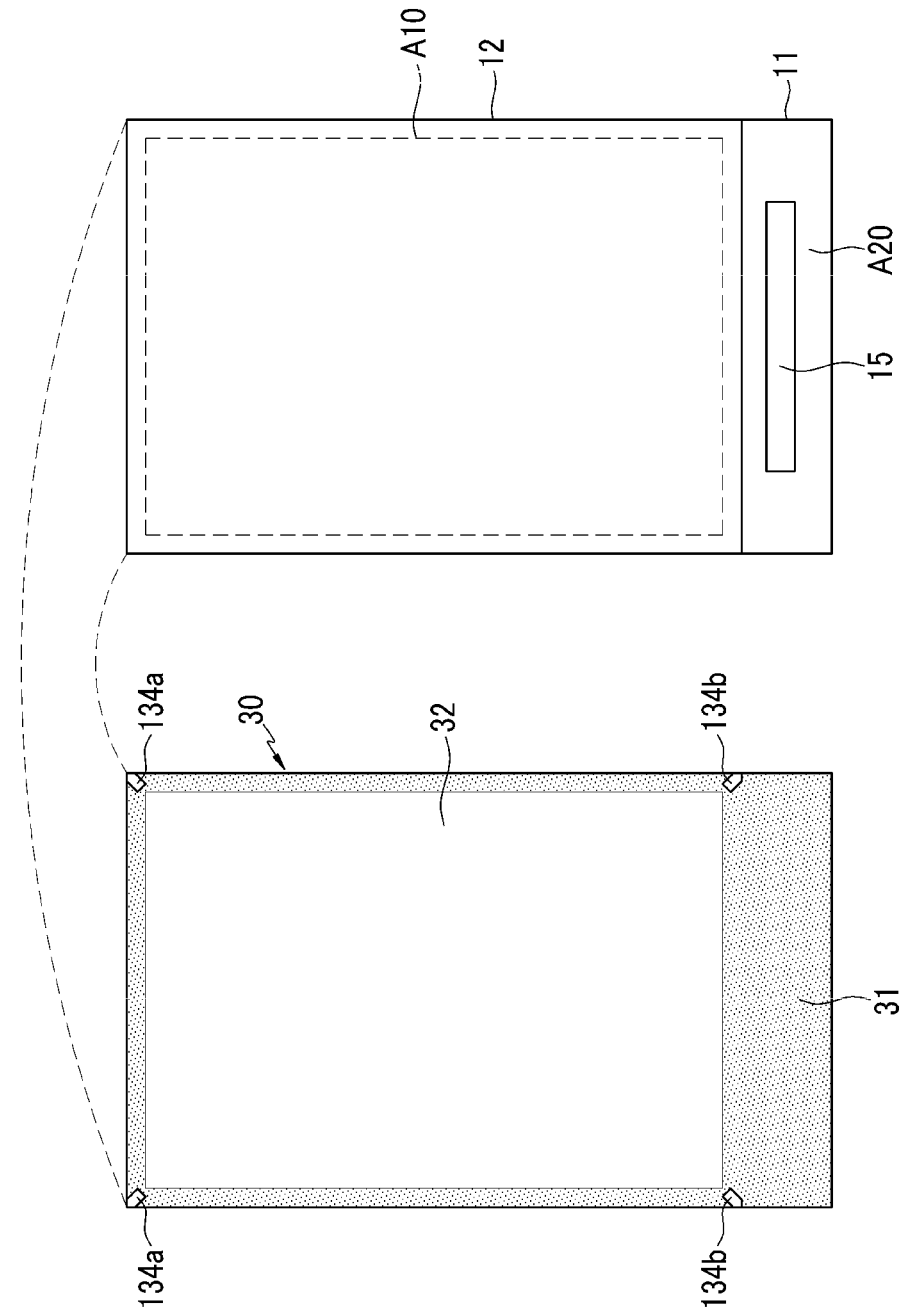
FIG. 9 is a schematic diagram illustrating an inner surface of a cover window and a display panel of an OLED display device according to a second exemplary embodiment of the invention.

FIG. 9 is a schematic diagram illustrating an inner surface of a cover window and a display panel of an OLED display device according to a second exemplary embodiment of the invention.

Referring to FIG. 9, the OLED display device of the second exemplary embodiment has the same configuration as that of the OLED display device of the foregoing first exemplary embodiment except that channels 134a and 134b are formed at an inner surface of the cover window 30 instead of the second substrate 12. Constituent elements identical to or corresponding to those of the first exemplary embodiment are denoted by the same reference numerals, and constituent elements different from those of the first exemplary embodiment will be described here in detail.

The cover window 30 has four orthogonal corners, and two orthogonal corners thereof are opposite to an orthogonal corner of the second substrate 12 and other two orthogonal corners are opposite to orthogonal corners of the first substrate 11. The cover window 30 forms the channel 134a at two orthogonal corners opposite to the orthogonal corner of the second substrate 12. Furthermore, the cover window 30 forms the channel 134b at a position opposite to an orthogonal corner of the second substrate 12 contacting the pad area A20.

The channels 134a and 134b that are formed in the cover window 30 are formed in a diagonal direction, are a single bar type having a constant width and a predetermined length, and may have a square, triangular, oval, or semicircular section shape. The channels 134a and 134b may be formed with a plurality of micro channels parallel to each other. FIG. 9 illustrates a single bar type channel. The channels 134a and 134b that are formed in the cover window 30 are positioned at the outside, i.e., the light blocking portion 31 of the display area A10 so as not to invade the display area A10.

Figure 10:
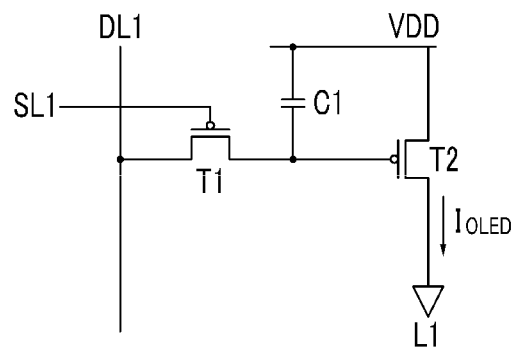
FIG. 10 is a layout view illustrating a pixel circuit of a display panel that is shown in FIG. 1.
Figure 11:
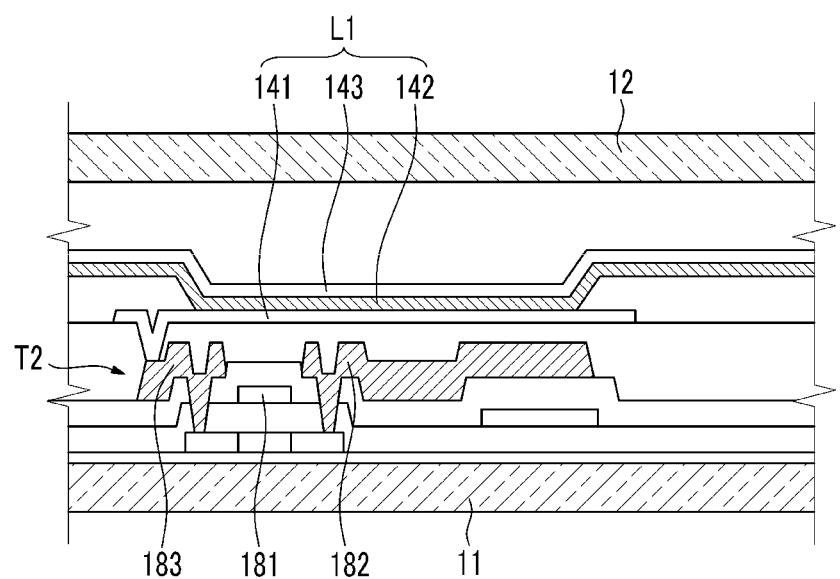
FIG. 11 is a partially enlarged cross-sectional view illustrating a display panel that is shown in FIG. 1.

FIG. 10 is a layout view illustrating a pixel circuit of a display panel that is shown in FIG. 1, and FIG. 11 is a partially enlarged cross-sectional view of a display panel that is shown in FIG. 1.

Referring to FIGS. 10 and 11, the pixel includes an OLED L1 and driving circuit portions T1, T2, and C1. The OLED L1 includes a pixel electrode 141, an organic emission layer 142, and a common electrode 143. The driving circuit portions T1, T2, and C1 include at least two thin film transistors (a switching transistor T1 and a driving transistor T2) and at least one capacitor C1.

The switching transistor T1 is connected to a scan line SL1 and a data line DL1, and transmits a data voltage that is inputted at the data line DL1 to the driving transistor T2 according to a switching voltage that is inputted to the scan line SL1. The capacitor C1 is connected to the switching transistor T1 and a power source line VDD, and stores a voltage corresponding to a difference between a voltage received from the switching transistor T1 and a voltage supplied to the power source line VDD.

The driving transistor T2 is connected to the power source line VDD and the capacitor C1 so as to supply an output current IOLED, proportional to the square of a difference between a voltage that is stored at the capacitor C1 and a threshold voltage, to the OLED L1, and the OLED L1 emits light with intensity proportional to the output current IOLED. The driving transistor T2 includes a gate electrode 181, a source electrode 182 and a drain electrode 183, and the pixel electrode 141 is connected to the drain electrode 183 of the driving transistor T2.

Figure 12:
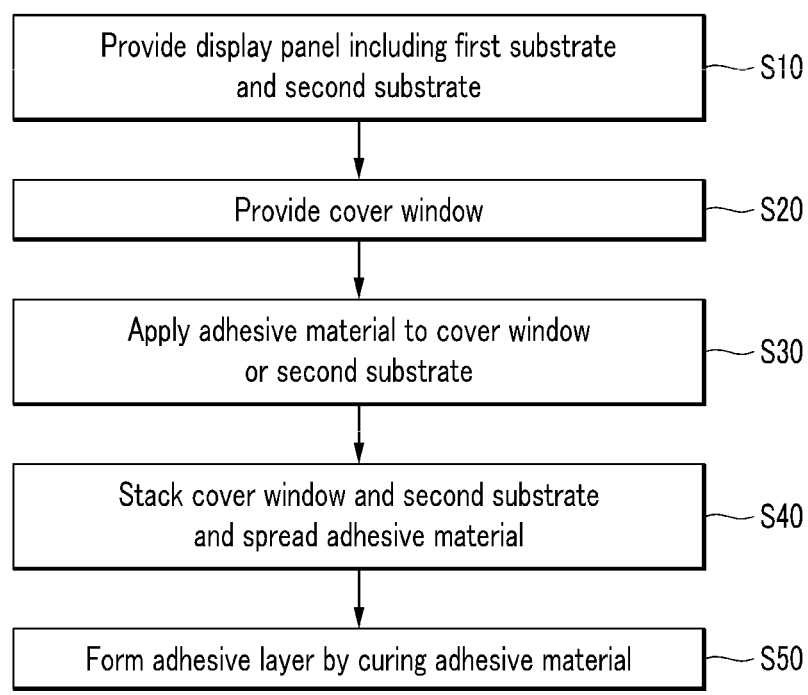
FIG. 12 is a process flowchart illustrating a method of manufacturing an OLED display device according to an exemplary embodiment of the invention.

FIG. 12 is a process flowchart illustrating a method of manufacturing an OLED display device according to an exemplary embodiment of the invention.

Referring to FIG. 12, the method of manufacturing an OLED display device includes first step S10 of providing a display panel including a first substrate having a display area and a pad area, and a second substrate that covers the display area, second step S20 of providing a cover window, and third step S30 of applying an adhesive material to the cover window or the second substrate. Furthermore, the method of manufacturing an OLED display device includes fourth step S40 of disposing the cover window on the second substrate so that an inner surface of the cover window is opposite to the second substrate and of widely spreading an adhesive material by applying a pressure to the cover window, and fifth step S50 of forming an adhesive layer by curing the adhesive material.

Figure 13:
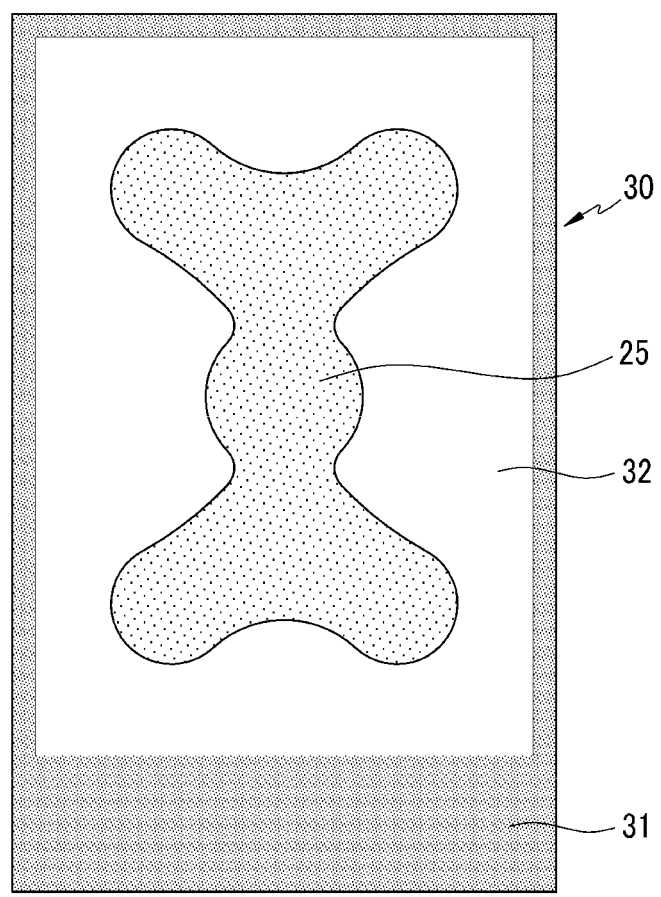
FIG. 13 is a top plan view illustrating a cover window of a third step that is shown in FIG. 12.

FIG. 13 is a top plan view illustrating a cover window of a third step that is shown in FIG. 12.

Referring to FIG. 13, at the third step S30, an adhesive material 25 is applied to the light emitting portion 32 of the cover window 30 in a liquid or paste form. The adhesive material 25 includes an acryl-based resin that is cured by UV rays or heat, and is applied in a shape that attaches approximately two Y in a vertical direction. FIG. 13 illustrates a case where the adhesive material 25 is applied to an inner surface of the cover window 30, but the adhesive material 25 may be applied to an outer surface of the second substrate 12.

Figure 14:
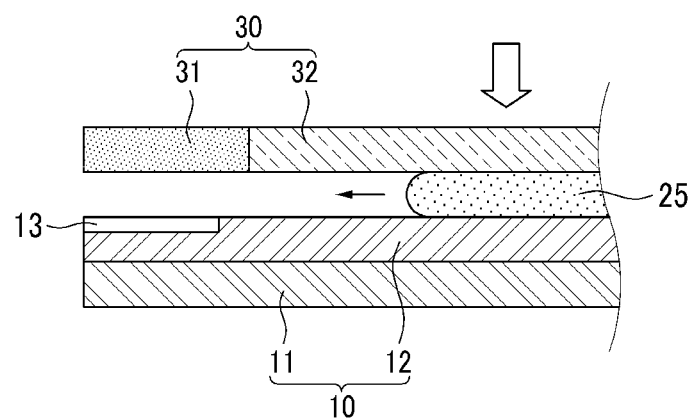
FIGS. 14 and 15 are cross-sectional views illustrating an OLED display device of a fourth step that is shown in FIG. 12.
Figure 15:
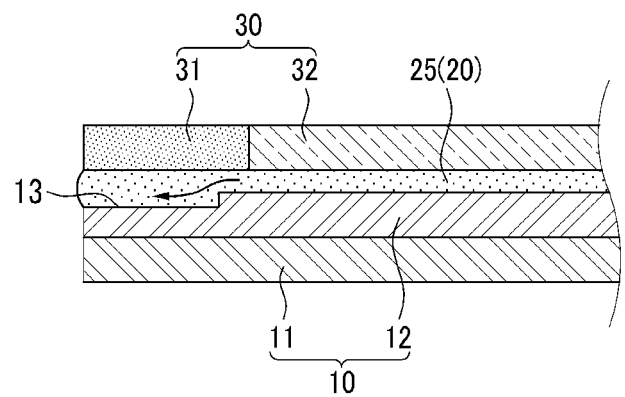

FIGS. 14 and 15 are cross-sectional views illustrating an OLED device display of a fourth step that is shown in FIG. 12.

Referring to FIGS. 14 and 15, at fourth step S40 of FIG. 12, the adhesive material 25 is widely spread in all directions by a stack pressure of the second substrate 12 and the cover window 30. In this case, because the concave channel 13 is formed at a corner of the second substrate 12, the adhesive material 25 that is spread toward the corner of the second substrate 12 easily flows in a length direction of the channel 13.

Therefore, the adhesive material 25 easily arrives up to an edge of the corner of the second substrate 12 along the channel 13 and precisely fills an entire edge of the corner of the second substrate 12. FIGS. 14 and 15 illustrate a case where the channel 13 is formed at the corner of the second substrate 12, but the channel 13 may be formed at an inner surface of the cover window 30.

In this way, as the channel 13 is formed in the second substrate 12 or the cover window 30, the OLED display device 100 according to the present exemplary embodiment increases an occupying area of the adhesive layer 20 at the corner of the second substrate 12 and can prevent a non-application failure in which the adhesive layer 20 does not fill an entire corner of the second substrate 12. As a result, a loose failure of the display panel 10 and the cover window 30 does not occur at the corner, and adhesion reliability of the display panel 10 and the cover window 30 can be enhanced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
 a display panel that displays an image and comprises a first substrate and a second substrate in a size smaller than that of the first substrate;
 a cover window that is positioned at an outside of a display surface of the display panel; and
 an adhesive layer that is positioned between the display surface and the cover window;
 wherein any one of the display panel and the cover window forms a concave channel in at least one corner filled with a part of the adhesive material layer;
 wherein the first substrate has a display area and a pad area, the second substrate is attached to the first substrate so as to cover the display area, and an outer surface of the second substrate comprises the display surface,
 wherein the display panel comprises a first substrate and as second substrate;
 wherein the concave channel comprises a flat bottom portion and a plurality of vertical side walls leading to a corner edge of the second substrate, the concave channel being open only at the corner edge of the second substrate;
 wherein the adhesive layer is substantially in the same area as that of the second substrate, and
 wherein a predetermined space is formed between the cover window and the pad area of the first substrate.

2. The OLED display device of claim 1, wherein the second substrate comprises four orthogonal corners and the concave channel is formed in at least one location of the four orthogonal corners.

3. The OLED display device of claim 2, wherein the concave channel is formed in a diagonal direction at the corner edge of the second substrate and is positioned at the outside of the display area.

4. The OLED display device of claim 2, wherein the concave channel is formed in a single bar type and has a section shape of any one of a quadrangle, a triangle, an oval, and a semicircle.

5. The OLED display device of claim 2, wherein the concave channel is formed with a plurality of micro channels having a triangular section shape parallel to each other.

6. The OLED display device of claim 1, wherein the cover window covers a light blocking portion corresponding to an edge of the display area comprising the pad area and a light emitting portion corresponding to the display area.

7. The OLEO display device of claim 6, wherein the second substrate comprises four orthogonal corners and the channel is formed at a position opposite to at least one corner of the four orthogonal corners on an inner surface of the cover window.

8. The OLEO display device of claim 7, wherein the concave channel is formed in a diagonal direction and positioned at the light blocking portion.

9. The OLED display device of claim 7, wherein the concave channel is formed in a single bar type and comprises a section shape of any one of a quadrangle, a triangle, an oval, and a semicircle.

10. The OLED display device of claim 7, wherein the concave channel comprises a plurality of micro channels having a triangular sectional shape parallel to each other.

\* \* \* \* \*